United States Patent
Kido

(10) Patent No.: US 8,761,830 B2
(45) Date of Patent: Jun. 24, 2014

(54) PROXIMITY SENSOR AND PORTABLE TERMINAL

(75) Inventor: Nobuhiko Kido, Kanagawa (JP)

(73) Assignees: Sony Corporation, Tokyo (JP); Sony Mobile Communications Inc., Tokyo (JP)

(*) Notice: Subject to any disclaimer, the term of this patent is extended or adjusted under 35 U.S.C. 154(b) by 38 days.

(21) Appl. No.: 13/408,576

(22) Filed: Feb. 29, 2012

(65) Prior Publication Data

US 2012/0238320 A1 Sep. 20, 2012

Related U.S. Application Data

(60) Provisional application No. 61/452,903, filed on Mar. 15, 2011.

(51) Int. Cl.
*H04M 1/00* (2006.01)

(52) U.S. Cl.
USPC .......... 455/556.1; 455/556.2; 455/575.1; 250/221; 250/239; 250/227.11; 250/227.24; 356/614

(58) Field of Classification Search
USPC ............ 250/227.11, 239, 221, 227.24; 455/556.1, 556.2, 575.1; 356/614
See application file for complete search history.

(56) References Cited

U.S. PATENT DOCUMENTS

| | | | | |
|---|---|---|---|---|
| 6,087,653 A | * | 7/2000 | Van Schyndel et al. | 250/227.11 |
| 6,835,923 B2 | * | 12/2004 | Hamalainen et al. | 250/227.11 |
| 8,450,679 B2 | * | 5/2013 | Yun | 250/239 |

FOREIGN PATENT DOCUMENTS

JP 2010-157513 7/2010

* cited by examiner

*Primary Examiner* — Junpeng Chen
(74) *Attorney, Agent, or Firm* — Oblon, Spivak, McClelland, Maier & Neustadt, L.L.P.

(57) ABSTRACT

A proximity sensor that includes a light emitting section that emits light; a light receiving section that detects the light emitted from the light emitting section reflected from an object; a window member that covers the light emitting section and the light receiving section; a first columnar portion disposed to extend between the light emitting section and the window member; and a second columnar portion disposed to extend between the light receiving section and the window member.

8 Claims, 8 Drawing Sheets

PROXIMITY SENSOR AND PORTABLE TERMINAL

CROSS REFERENCE TO RELATED APPLICATION

The present application claims the benefit of the earlier filing date of U.S. Provisional Patent Application Ser. No. 61/452,903 filed on Mar. 15, 2011, the entire contents of which is incorporated herein by reference.

BACKGROUND OF THE DISCLOSURE

1. Field of the Disclosure

The present disclosure relates to a proximity sensor for detection of an approaching state of an object, and in particular to a proximity sensor that is suitable for application to a portable terminal.

2. Description of Related Art

In recent years, portable terminals called "smartphones" have been widely used. In many smartphones, a touch screen in which a display screen also serves as a touch panel is used. When a user brings his/her ear close to a sound output port of an ear receiver provided at a predetermined location of a housing of such a portable terminal during a conversation or the like, the face or the ear of the user may contact the touch screen. However, such a contact with the touch screen is not intended by the user to be performed on the touch screen.

In the related art, in order not to incur an improper operation of the touch screen in such a case, a proximity sensor is used to sense an approach of an ear or a cheek of the user in order to stop an operation of the touch screen and prevent an improper action of the touch panel.

Usually, a flat window member made of glass, plastic, or the like is provided in a housing member above a light emitting section and a light receiving section of the proximity sensor. If the window member has a large thickness, however, light emitted from the light emitting section may be scattered or reflected inside the window member to directly arrive at the light receiving section. In this case, the proximity sensor may improperly recognize that there is an object in proximity even if there is no such object in proximity to the proximity sensor.

For example, a case where a proximity sensor including a light emitting section 11 and a light receiving section 12 provided on a substrate (circuit substrate) 60 faces a window member 13 provided in a housing 50 as shown in FIG. 2 is considered. In this case, if the window member 13 has an appropriate thickness, an object in proximity 70 is appropriately detected with little of light scattered inside the window member 13 to arrive at the light receiving section 12. Therefore, no improper operation of the proximity sensor is caused.

However, in the case where the window member 13 has a large thickness and thus has a space that is enough for light from the light emitting section 11 to be scattered inside the window member 13 to arrive at the light receiving section 12 as shown in FIG. 3, the proximity sensor may produce a detection output that indicates presence of an object in proximity even when there is no such an object in proximity. Meanwhile, for convenience of mounting a proximity sensor in a portable terminal, the proximity sensor provided on the substrate 60 and the window member 13 may be more or less spaced apart from each other. In this case, it is necessary for the window member 13 to have a large thickness.

An improvement may be achieved by physically separating the light emitting section and the light receiving section from each other in position. In that case, however, it may be difficult to secure a space that allows the light emitting section and the light receiving section to be sufficiently separated from each other in the portable terminal because of a reduced size of the terminal. In the case where a proximity sensor in which the light emitting section and the light receiving section are integrated with each other is used, the distance between the light emitting section and the light receiving section may not be increased any further.

The above issues may be addressed by reducing the power for driving the light emitting section. In this case, however, the distance over which an object in proximity is recognizable may be reduced, and the performance of the proximity sensor may not be satisfactory.

Thus, it is necessary to design the window member such that no improper operation is incurred even in the case where the proximity sensor has a large window thickness.

Japanese Unexamined Patent Application Publication No. 2010-157513 describes a sensing device according to the related art that uses a proximity sensor which senses presence or absence of a foreign object in proximity and an improper action of which is prevented. In the sensing device, a lens section provided above the proximity sensor is structured such that an opaque reflective film is formed inside a transparent lens main body to prevent an improper action of the proximity sensor and enhance the accuracy with which the proximity sensor senses presence or absence of a foreign object in proximity.

However, the device according to the related art includes a large number of components forming the window member, which complicates the manufacture and increases the cost.

SUMMARY

Against such background, the inventor recognized the need for a proximity sensor, an improper action of which is prevented, even in the case where the proximity sensor has a large window thickness, without increasing the number of components or the area for installation of light emitting section/light receiving section.

According to an embodiment of the present disclosure, there is provided a proximity sensor that includes a light emitting section that emits light; a light receiving section that detects the light emitted from the light emitting section reflected from an object; a window member that covers the light emitting section and the light receiving section; a first columnar portion disposed to extend between the light emitting section and the window member; and a second columnar portion disposed to extend between the light receiving section and the window member.

According to the proximity sensor structured in accordance with the embodiment of the present disclosure, it is possible to prevent an improper action of the proximity sensor, even in the case where the proximity sensor has a large window thickness, without increasing the number of components or the area for installation of the light emitting section/light receiving section.

DETAILED DESCRIPTION

Figure 1:
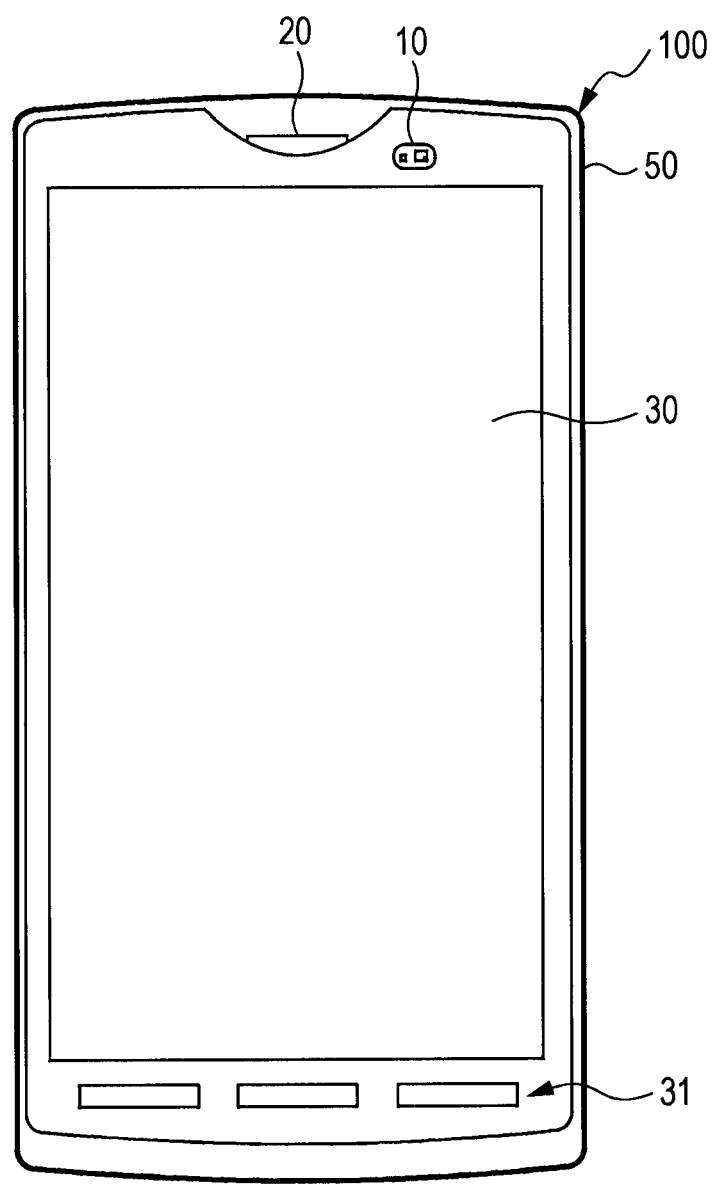
FIG. 1 shows an example of a portable terminal including a proximity sensor according to an embodiment of the present disclosure.

FIG. 1 shows an example of a portable terminal 100 including a proximity sensor 10 according to the embodiment. The portable terminal 100 includes a display section 30 forming a touch screen disposed on the front surface of a housing 50. The display section 30 is formed by a liquid crystal display, for example. A touch area that detects a touch by a finger of a user, a pen, or the like is provided to overlap a display area of a display screen of the display section 30. Also on the front surface of the housing 50, a receiver sound hole 20 is disposed at the center of the upper part of the display section 30. The proximity sensor 10 is disposed next to the receiver sound hole 20. An operating section 31 such as operating keys is disposed at the lower part of the front surface of the housing 50.

The proximity sensor 10 is an element for detection of an approaching state of an object. Specifically, when the user holds the housing 50 and brings the receiver sound hole 20 close to his/her ear to make a conversation, the proximity sensor 10 detects that the head of the user has come into proximity. In response to a detection output from the proximity sensor 10, a control section (not shown) of the portable terminal 100 hinders a touch detection function of the touch screen. This prevents an improper action of the touch screen even if an ear or a cheek of the user touches the touch screen during a conversation.

While the portable terminal 100 including the proximity sensor 10 is shown as a portable terminal of a so-called straight type, the portable terminal is not limited to the straight type.

Figure 4:
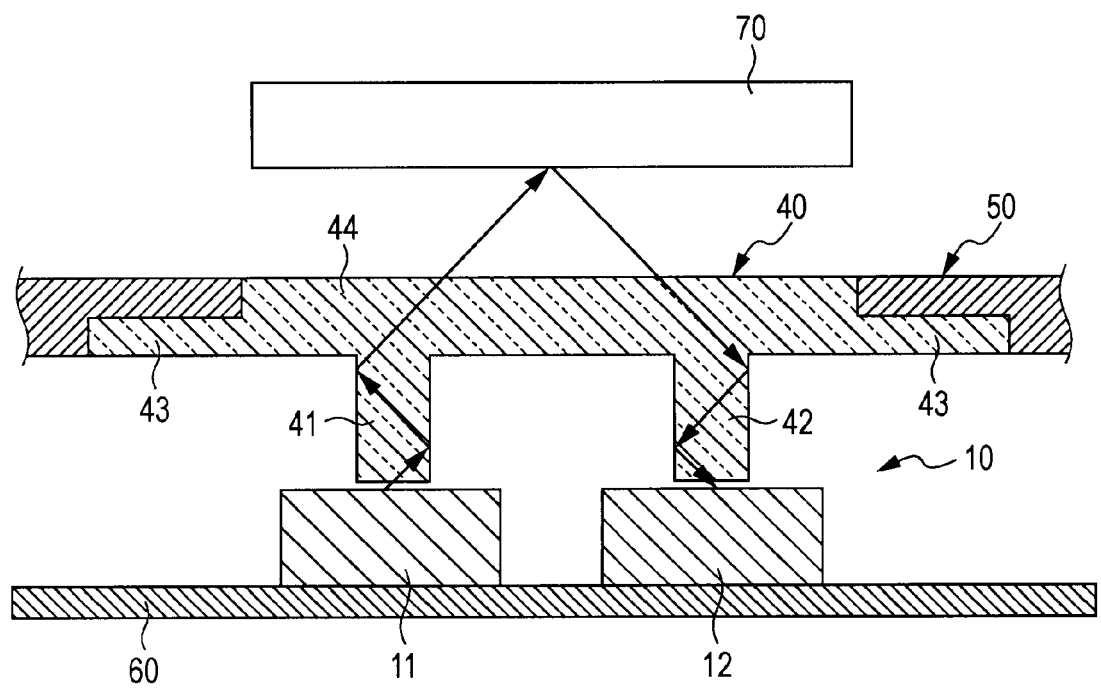
FIG. 4 is a cross-sectional view of a part of the portable terminal, showing an example of the configuration of the proximity sensor according to the embodiment of the present disclosure.

FIG. 4 is a cross-sectional view of a part of the portable terminal, showing an example of the configuration of the proximity sensor 10 according to the embodiment.

The proximity sensor 10 includes a light emitting section 11, a light receiving section 12, and a window member 40.

The light emitting section 11 emits light such as infrared light, and is formed by a light emitting element such as a light emitting diode, for example. In the example shown, light is emitted upward from the center of the upper surface of the light emitting section 11. The light receiving section 12 is disposed side by side with the light emitting section 11 to detect the light emitted from the light emitting section 11 and reflected light from an object in proximity 70. The light receiving section 12 is formed by a light receiving element such as a photodiode or a phototransistor, for example. In the example shown, the light receiving section 12 has a light receiving area at the center of the upper surface of the light receiving section 12. The light emitting section 11 and the light receiving section 12 are mounted on a substrate (circuit substrate) 60, on which various components of the portable terminal are mounted. While the light emitting section 11 and the light receiving section 12 are shown as separate components in the example, the light emitting section 11 and the light receiving section 12 may be an integrated component.

Figure 2:
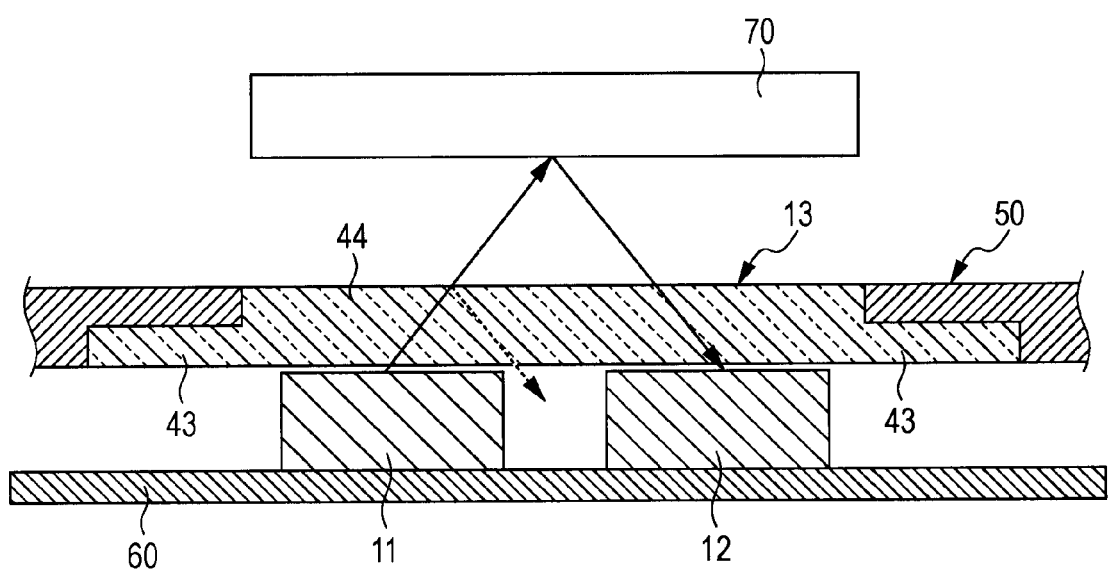
FIG. 2 shows the configuration of a proximity sensor according to the related art.
Figure 3:
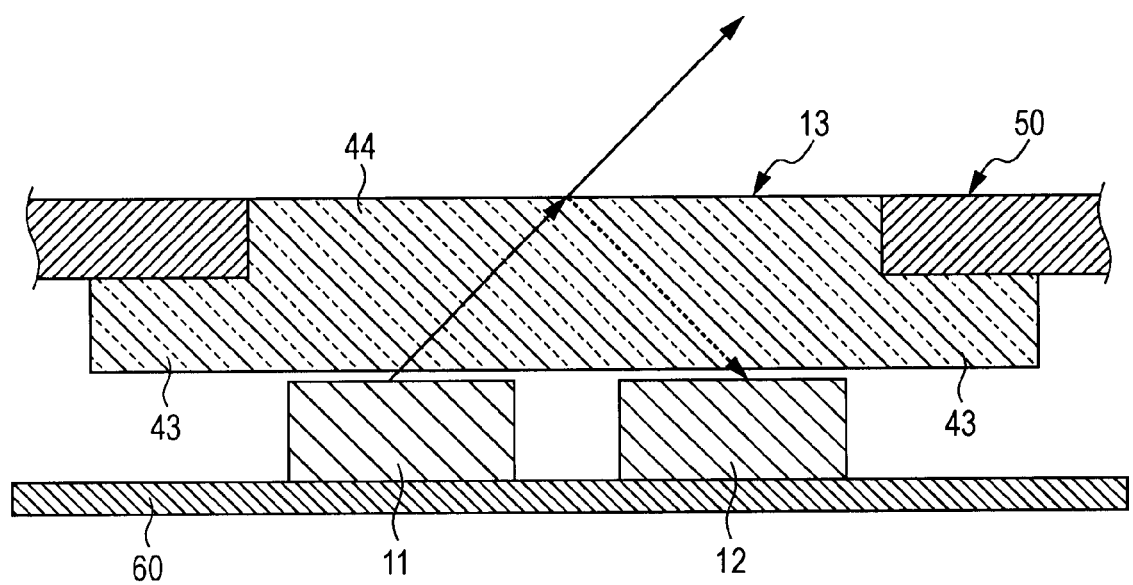
FIG. 3 illustrates an issue of the proximity sensor according to the related art.

The window member 40 is a member that is disposed at an opening portion of the housing 50 so as to cover the light emitting section 11 and the light receiving section 12, and is integrally formed from a transparent material that transmits the light emitted from the light emitting section 11 and the reflected light, such as glass or a synthetic resin, for example. In structure, the window member 40 includes a flat plate portion 44 exposed to block the opening portion of the housing 50 so as to oppose an object in proximity, a flange portion 43 projecting from the periphery of the flat plate portion 44, and a first columnar portion 41 and a second columnar portion 42 formed integrally with the flat plate portion 44 to project toward the light emitting section 11 and the light receiving section 12, respectively, from the back surface of the flat plate portion 44. The columnar portion 41 functions to guide the light emitted from the light emitting section 11 to the flat plate portion 44. The light emitted from the light emitting section 11 travels in the columnar portion 41 while being totally reflected by the inner side surfaces of the columnar portion 41, enters the flat plate portion 44, and is discharged from the top surface of the flat plate portion 44. Likewise, the columnar portion 42 functions to guide the reflected light incident on the flat plate portion 44 from the object in proximity 70 to the light receiving section 12. The arrows shown in FIGS. 2, 3, and 4 represent typical light rays, and there may also be light rays that pass through other paths. For convenience of illustration, refraction of light at the interface between the window member 13 and air is ignored.

The flange portion 43 is thinner than that of the flat plate portion 44, and extends from the periphery of the flat plate portion 44 in parallel with the flat plate portion 44. The flange portion 43 is utilized for retention on the periphery of the opening portion of the housing 50. Any existing retention mechanism such as through screwing, engagement, or bonding may be utilized for the retention. The flange portion 43 itself is not an element that is essential as long as the window member 40 may be otherwise retained on the housing 50.

The thickness of the flat plate portion 44 is set to be sufficiently smaller than a thickness with which the light emitted from the light emitting section 11 and reflected by the surface (interface) of the window member 13 is directly incident on the light receiving section 12 as shown in FIG. 3. As a result, an improper action in which the light emitted from the light emitting section 11 is directly incident on the light receiving section 12 in the absence of the object in proximity 70 is prevented.

Figure 5:
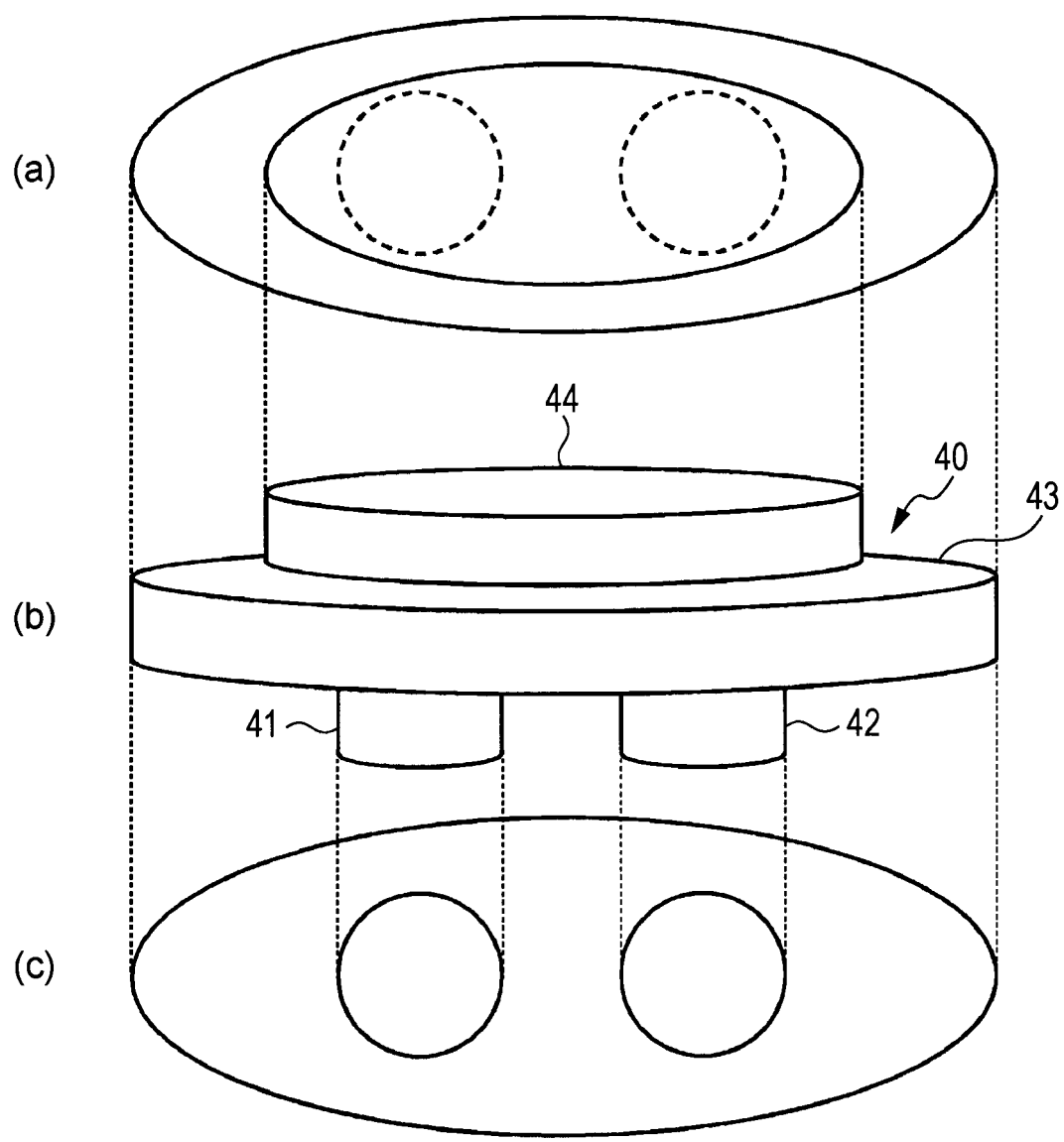
FIGS. 5A, 5B, and 5C are a top view, a perspective view, and a bottom view, respectively, of a window member.

FIGS. 5A, 5B, and 5C are a top view, a perspective view, and a bottom view, respectively, of the window member 40. In the example, the columnar portions 41 and 42 have a cylindrical shape. The respective diameters of the columnar portions 41 and 42 may be the same as each other, or the diameter of the columnar portion 42 on the light receiving side may be larger than the diameter of the columnar portion 41 on the light emitting side to increase the light receiving sensitivity. The respective top surfaces of the flat plate portion 44 and the flange portion 43 have an oval shape. It should be noted that the actual size of the window member 40 is sufficiently smaller than shown in FIG. 5. For example, even the longest portion of the window member 40 is less than 1 cm long. In the embodiment, the major axis and the minor axis of the flange portion 43 having an oval cross section are about 9 mm long and about 7 mm long, respectively. Likewise, the major axis and the minor axis of the flat plate portion 44 are about 5 mm long and about 3 mm long, respectively. The flat plate portion 44 and the flange portion 43 are each about 1 mm thick (tall). The columnar portions 41 and 42 are about 1 mm tall, and have a diameter of about 1.5 mm. These dimensions are merely exemplary sizes in a typical embodiment, and the present disclosure is not limited to such specific dimensions.

Figure 6:
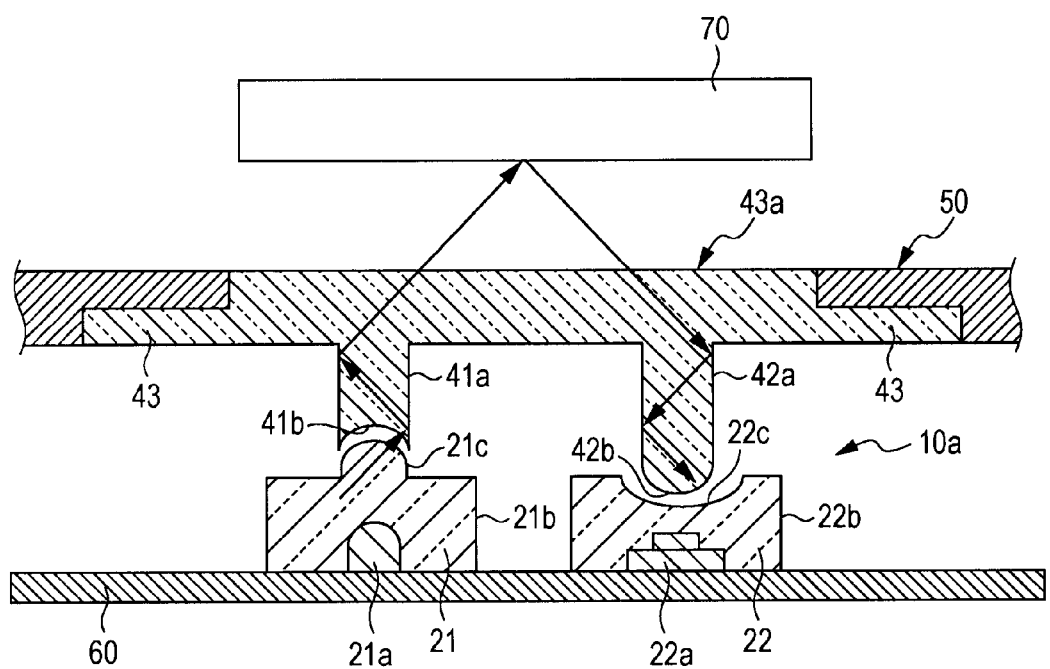
FIG. 6 shows a variation of the proximity sensor shown in FIG. 4.

FIG. 6 shows a proximity sensor 10a provided as a variation of the proximity sensor 10 shown in FIG. 4.

The proximity sensor 10a includes a light emitting section 21, a light receiving section 22, and a window member 43a. The light emitting section 21 is formed by a convex adapter 21b that houses a light emitting element 21a inside the convex adapter 21b. The convex adapter 21b is formed from a material that transmits light (here, infrared light), and includes a substantially hemispherical convex portion 21c on top of the convex adapter 21b. Preferably, surface portions of the convex adapter 21b other than the surface of the convex portion 21c are covered such that light is discharged from the inside to the outside of the convex adapter 21b only through the surface of the convex portion 21c.

A concave portion 41b is formed in the bottom portion of a columnar portion 41a so as to face the convex portion 21c of the light emitting section 21. This allows good light coupling from the light emitting section 21 to the columnar portion 41a.

The light receiving section 22 is formed by a concave adapter 22b that houses a light receiving element 22a inside the convex adapter 22b. The concave adapter 22b is formed from a material that transmits light (here, infrared light), and includes a substantially hemispherical concave portion 22c on top of the concave adapter 22b. Preferably, surface portions of the concave adapter 22b other than the surface of the concave portion 22c are covered such that light is transmitted from the outside to the inside of the concave adapter 22b only through the surface of the concave portion 22c.

A convex portion 42b is formed on the bottom portion of a columnar portion 42a so as to face the concave portion 22c of the light receiving section 22. This allows good light coupling from the columnar portion 42a to the light receiving section 22.

Other configurations and functions of the proximity sensor 10a are the same as those of the proximity sensor 10 shown in FIG. 4.

The proximity sensor according to the embodiment described above has the following characteristics.

(a) The window member is formed by a single component. This reduces the number of components.

(b) The window member includes a flat plate portion and respective columnar portions that guide light to the light emitting section and from the light receiving section. This makes it possible to increase the thickness of the entire window member while reducing the thickness of the flat plate portion itself.

(c) Basically, no structure for blocking light is required between the light emitting section and the light receiving section. This makes it possible to reduce the area for installation of the light emitting section/light receiving section.

Figure 7:
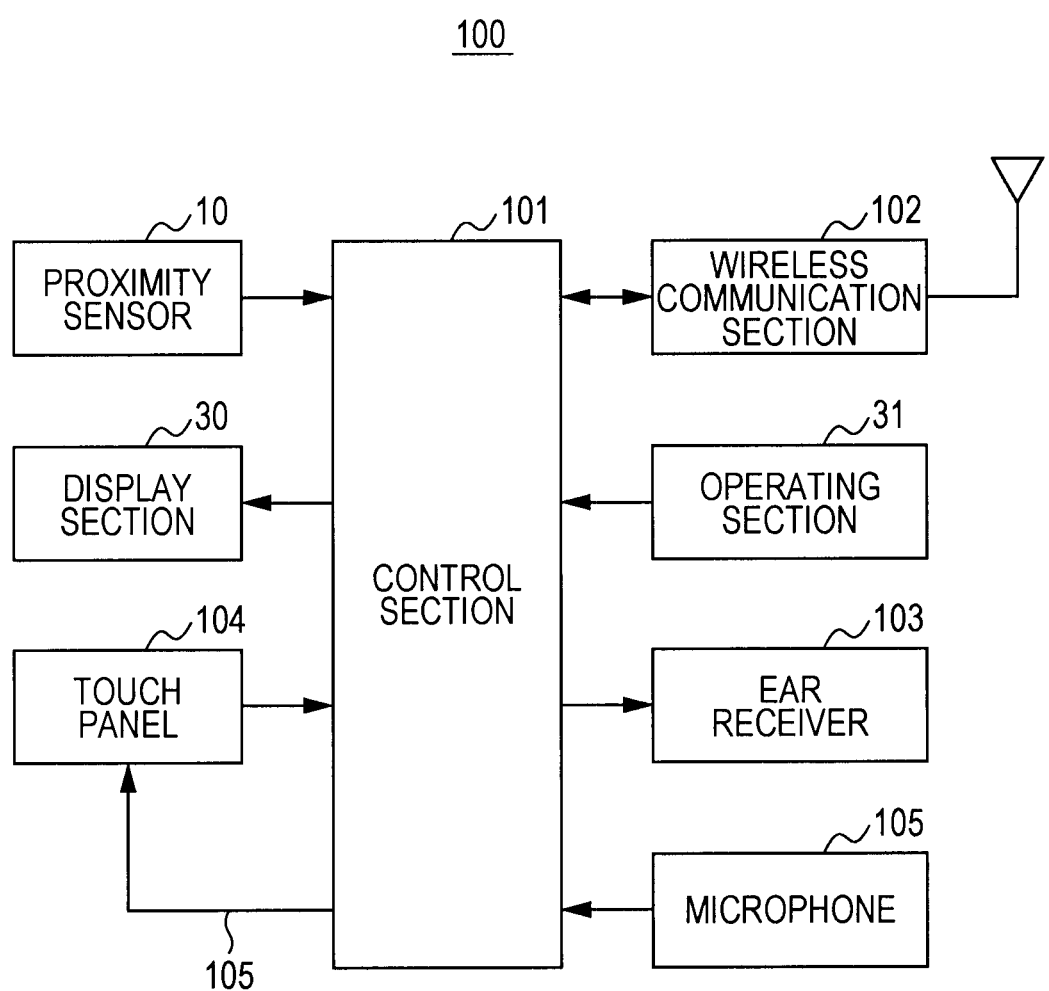
FIG. 7 is a functional block diagram of a configuration for achieving the function of the portable terminal shown in FIG. 1.

FIG. 7 is a functional block diagram showing a configuration for achieving the function of the portable terminal 100 shown in FIG. 1. Elements that are the same as those shown in FIG. 1 are denoted by the same reference numerals.

In the portable terminal 100, a control section 101 including a CPU, a memory, and various circuits performs necessary control and processing. The proximity sensor 10, the display section 30, the operating section 31, a wireless communication section 102, an ear receiver (speaker) 103, a touch panel 104, and a microphone 105 are connected to the control section 101. The display section 30 and the touch panel 104 form the touch screen discussed above with a touch input area provided over substantially the entire surface of a display screen. The wireless communication section 102 performs wireless communication with a base station for audio communication, data communication, and so forth.

The control section 101 activates the proximity sensor 10 when a conversation is had on the portable terminal 100. When the proximity sensor 10 detects the object in proximity 70, the control section 101 outputs a control signal 105 to the touch panel 104 to hinder an operation of the touch panel 104. This prevents an improper action of the touch screen by disabling an operation of the touch panel 104 when an ear or a cheek of the user is detected as the object in proximity 70 when the user holds the portable terminal 100 to make a conversation.

While a preferred embodiment has been described above, various changes and modifications other than those mentioned above may be made. That is, it should be understood as a matter of course by those skilled in the art that various modifications, combinations, and other embodiments may occur depending on design requirements and other factors insofar as they are within the scope of the appended claims or the equivalents thereof.

Figure 8:
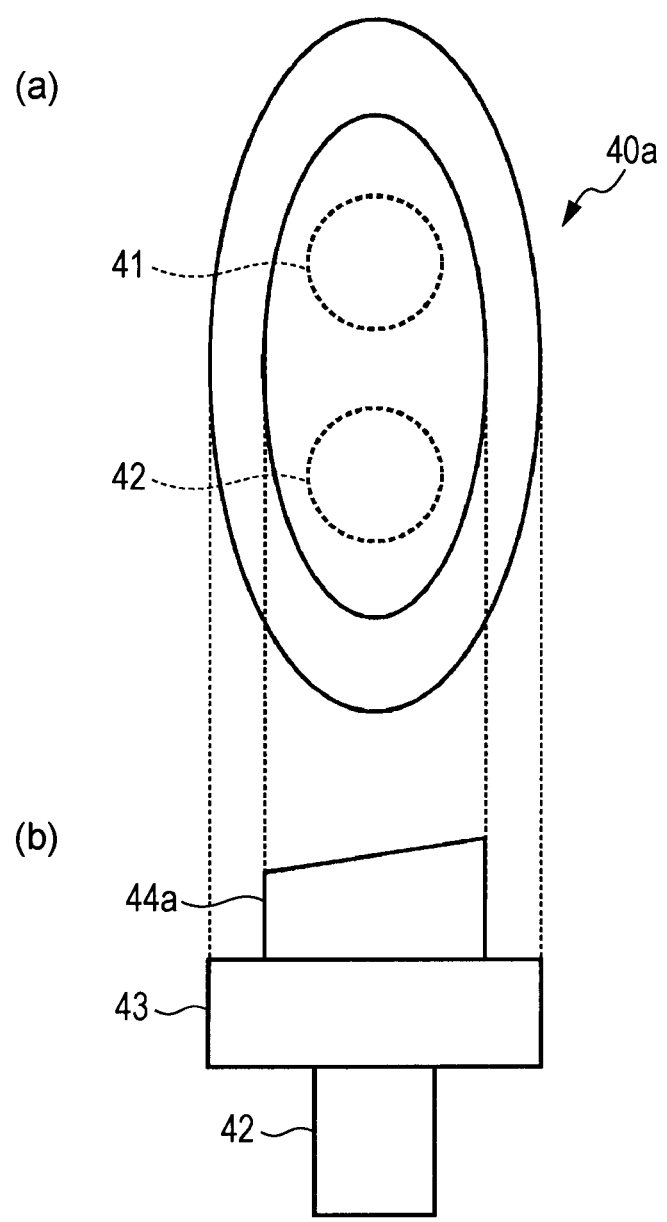
FIGS. 8A and 8B are a top view and a side view, respectively, of a window member as a variation of the embodiment of the present disclosure.

For example, FIGS. 8A and 8B are a top view and a side view, respectively, of a window member 40a as a variation of the window member 40 discussed above. As well illustrated in FIG. 8B, the top surface of a flat plate portion 44a may be inclined by a predetermined angle with respect to the bottom surface of the flat plate portion 44a. The direction of the inclination is not necessarily limited to the direction shown in the drawing.

In the proximity sensor 10a shown in FIG. 6, while the convex adapter 21b is used in the light emitting section 21, the light emitting element 21a may be used to directly face the columnar portion 41a. Also, in the light receiving section 22, the light receiving element 22a may be used to directly face the columnar portion 42a rather than using the concave adapter 22b.

The invention claimed is:

1. A proximity sensor comprising:
a light emitting section that emits light;
a light receiving section that detects the light emitted from the light emitting section reflected from an object;
a window member that covers the light emitting section and the light receiving section;
a first columnar portion that is integrally formed with the window member and is cylindrical in shape disposed to extend between the light emitting section and a flat plate portion of the window member; and
a second columnar portion that is integrally formed with the window member and is cylindrical in shape disposed to extend between the light receiving section and the flat plate portion of the window member, wherein
the window member includes a flange portion having a thickness that is less than a thickness of the flat plate portion, and
the flat plate portion and the flange portion both have an oval shape.

2. The proximity sensor of claim 1, wherein the window member includes a flat plate portion that opposes the object.

3. The proximity sensor of claim 1, wherein the flange portion extends from a periphery of the flat plate portion in parallel with the flat plate portion.

4. The proximity sensor of claim 1, wherein a major axis of the flat plate portion is 5 mm and a minor axis of the flat plate portion is 3 mm, and a major axis of the flange portion is 9 mm and a minor axis of the flange portion is 7 mm.

5. The proximity sensor of claim 1, wherein the flat plate portion is 2 mm thick, and the flange portion is 1 mm thick.

6. The proximity sensor of claim 1, wherein the first and second columnar portions are 1 mm in length.

7. The proximity sensor of claim 1, wherein the first and second columnar portions have a diameter of 1.5 mm.

8. A mobile communication device comprising:
   a proximity sensor including
      a light emitting section that emits light;
      a light receiving section that detects the light emitted from the light emitting section reflected from an object;
      a window member that covers the light emitting section and the light receiving section;
      a first columnar portion that is integrally formed with the window member and is cylindrical in shape disposed to extend between the light emitting section and a flat plate portion of the window member; and
      a second columnar portion that is integrally formed with the window member and is cylindrical in shape disposed to extend between the light receiving section and the flat plate portion of the window member, wherein
   the window member includes a flange portion having a thickness that is less than a thickness of the flat plate portion, and
   the flat plate portion and the flange portion both have an oval shape.

* * * * *